United States Patent [19]

Popovic

[11] Patent Number: 4,910,570
[45] Date of Patent: Mar. 20, 1990

[54] PHOTO-DETECTOR FOR ULTRAVIOLET AND PROCESS FOR ITS PRODUCTION

[75] Inventor: Radivoje Popovic, Zug, Switzerland

[73] Assignee: Landis & Gyr Betriebs AG, Zug, Switzerland

[21] Appl. No.: 207,715

[22] Filed: Jun. 16, 1988

[30] Foreign Application Priority Data

Jun. 22, 1987 [CH] Switzerland ........................ 02358/87
Apr. 14, 1988 [CH] Switzerland ........................ 01387/88

[51] Int. Cl.$^4$ ............................................. H01L 27/14
[52] U.S. Cl. .......................................... 357/30; 357/15
[58] Field of Search ................. 357/30 B, 30 C, 30 F, 357/30 I, 30 R, 15; 250/226, 227; 350/1.6

[56] References Cited

U.S. PATENT DOCUMENTS

| 3,418,473 | 12/1968 | Blue | 357/30 F |
| 3,560,812 | 2/1971 | Hall | 357/30 C |
| 3,852,591 | 12/1974 | Lee et al. | |
| 4,072,544 | 2/1978 | DeWinter et al. | |
| 4,141,756 | 2/1979 | Chiang | 357/30 F |
| 4,319,258 | 3/1982 | Harnagel | 357/30 C |
| 4,496,964 | 1/1985 | Tsubouchi | 357/30 C |
| 4,594,605 | 6/1986 | Kramer | |
| 4,686,556 | 8/1987 | Dietrich | |
| 4,710,589 | 12/1987 | Meyers et al. | |

OTHER PUBLICATIONS

H. F. Wolf, "Semiconductors", Wiley-Interscience, 1971, p. 105.
T-E Hansen, "Silicon Detectors for the UV- and Blue Spectral Regions with Possible Use as Particle Detectors", Nuclear Instr. & Methods in Physics. Res., vol. A-235, (1985), pp. 249-253.
T. Ando et al., "Photoresponses in In$_2$O$_3$ Transparent Gate MOS Capacitors", IEEE Trans. on Electron Devices, vol. ED-29, No. 8, (1982), p. 1161/2.
T. E. Hansen, "Silicon UV-Photodiodes Using Natural Inversion Layers", Physica Scripta, vol. 18, (1978), p. 471-475.
Choosing and Using CMOS, M. J. Walsh, (1985), "CMOS Technology" by D. J. Foster et al., Chapter 2.

Primary Examiner—Martin H. Edlow
Attorney, Agent, or Firm—Marmorek, Guttman & Rubenstein

[57] ABSTRACT

A semiconductor photo-detector is disclosed. The inventive photo-detector is especially sensitive to light in the ultraviolet and/or blue portions of the spectrum. The semiconductor body comprising the detector is arranged with a band structure which, through use of a potential threshold, delimits a particular region of the semiconductor body. Illustratively, the particular delimited region is coincident with the region where ultraviolet and/or blue light is absorbed. Charge carriers generated in the delimited region through the absorption of ultraviolet and/or blue light contribute to the output signal. Other wavelengths of light are absorbed in the semiconductor body outside the delimited region. The charged particles generated by the absorption of light outside the delimited region do not contribute to the output signal.

11 Claims, 3 Drawing Sheets

PHOTO-DETECTOR FOR ULTRAVIOLET AND PROCESS FOR ITS PRODUCTION

FIELD OF THE INVENTION

The instant invention relates to a photo-detector such as would be used, for example, in a flame-monitoring instrument.

BACKGROUND OF THE INVENTION

Photo-detectors made of semiconductor material are known. They are extraordinarily sensitive to infrared radiation with a wavelengths of 800 nm. The sensitivity of these photo-detectors to light decreases rapidly to negligible values as the wavelengths becomes shorter because the reflection losses at the point of entry into the semiconductor and the absorption of the radiation in the crystal increase sharply. For example, the depth of penetration of radiation of 800 nm into silicon at room temperature is approximately 10,000 nm. The depth of penetration of violet radiation of 400 nm is approximately 200 nm and the penetration depth of radiation in the ultra-violet range with a wavelength of 200 nm is only 10 nm. (H. F. Wolf, Semiconductors, Wiley-Interscience 1971, ISBN 0-471-95949-9). Furthermore, pairs of charged particles are lost near the surface of the semiconductor due to recombination. These losses through recombination affect mainly those charged particles which are produced by the radiation of shorter wavelengths.

In photo-detectors with semiconductor structures having a P-N junction immediately under the surface these recombination losses are considerably reduced near the surface. T. E. Hansen, in "Silicon Detectors for the UV- and Blue Spectral Regions with Possible Use as Particle Detectors", Nuclear Instruments and Methods in Physics Research Vol. A235 (1985) p. 249, describes photo-detectors made of N-type or P-type silicon which are also sensitive to radiations of the ultraviolet spectral region.

The photo-detectors made of P-type silicon have an MOS structure. The MOS structure naturally forms a very thin N+ inversion layer, at the interface between the insulator and the P-type semiconductor.

The photo-detectors made of N-type silicon in the form of a diode have a thin P+ type layer doped with boron by ion bombardment at the point of entry of the radiation directly at the surface, said layer, together with the substrate, forming a P-N junction.

Instead of the P-N junction, a Schottky contact to the N-type silicon can also be used.

A PIN diode used as a photodiode for infrared radiation is known to have an intermediate zone located between a P-type and an N-type zone. The intermediate zone is intrinsic and is typically 50 Mm wide.

The reflection losses can be reduced by means of a coating, the thickness of which is adapted to the wavelengths of the light, said coating constituting an entrance window with a lower refraction index than that of the semiconductor material (T. Ando & C-K Fong "Photoresponses in $In_2O_3$-Transparent Gate MOS Capacitors", IEEE Transactions on Electron Devices, Vol. ED-29, No. 8, August 1982, p. 1161).

Ultraviolet-sensitive semiconductor photo-detectors according to the state of the art are still more sensitive by several factors to red light with longer wavelengths than to light with shorter wavelengths of less than 400 nm (W. Schmidt and O. Feustel, Optoelektronik, Vogelverlag, Wüzburg 1975, page 62, ISBN 3-8023-0076-9).

These photo-detectors are not suited for applications such as in an instrument to monitor a flame, for example. A selective, and therefore expensive, filter is required to keep light with longer wavelengths away from the detector. Interference filters are known from "Concepts of Classical Optics" by John Strong, 1958, ISBN 0 7167 0301 7.

It is an object of the instant invention to create a photo-detector made of semiconductor material which has a greater sensitivity in the range of wavelengths from 200 nm to 400 nm than in the spectral range above 400 nm.

SUMMARY OF THE INVENTION

The present invention is a semiconductor photo-detector. Illustratively, the inventive photo-detector is especially sensitive to light in the ultraviolet and blue portions of the electromagnetic spectrum.

The semiconductor body comprising the detector of the present invention is arranged with a band structure which, through use of a potential threshold, delimits a particular region of the semiconductor body. Illustratively, the delimited region is coincident with the region where ultraviolet and/or blue light is absorbed. Charge carriers generated in the delimited region through the absorption of blue and/or ultraviolet light contribute to the output signal Other wavelengths of light are mainly absorbed in the semiconductor body outside the delimited region. Charged particles generated by the absorption of light outside the delimited region do not contribute in a significant manner to the output signal.

The delimited region for the absorption and detection of the short wavelength radiation may be significantly smaller than the remaining semiconductor volume available for the absorption of other wavelengths. Thus, many more charged particles may be produced in the remaining volume by the longer wavelengths than in the delimited region due to the shorter wavelengths. However, only the charged particles produced in the delimited region contribute to the output signal.

DETAILED DESCRIPTION OF THE INVENTION

Figure 1:
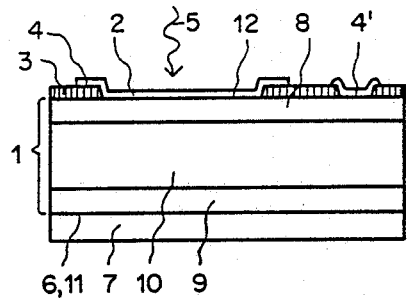
FIG. 1 shows a schematic cross-section of a diode used as a photo-detector with a Schottky contact and made of an N-type semiconductor in accordance with an illustrative embodiment of the present invention.

FIG. 1 shows an embodiment according to the invention of a photo-detector with sensitivity in the ultraviolet spectral range. The photo-detector has the basic structure of a diode and comprises a series of layers produced by doping in a substrate 1 made of an N-type semiconductor. At least one entrance window 2 is provided in an insulating cover layer 3 at the front of substrate 1. The entrance window 2 is covered with an electrode 4 which is transparent to electromagnetic radiation 5. The radiation which penetrates into the semiconductor through electrode 4 produces, upon absorption, at least one pair of charged particles. The electrode 4 and a terminal 7 provided at the back 6 of substrate 1 collect the charged particles produced by radiation 5.

The side of substrate 1 which faces electrode 4 is doped in decreasing concentration in the direction away from electrode 4 and constitutes an N+ layer 8. The back 6 has a heavily doped N++ layer 9. An intermediate layer 10 made of the N-type material of substrate 1 is located between layers 8 and 9.

The photo-detector of FIG. 1 is preferably made of easily obtained and inexpensive silicon. Known processes for the production of the different layers, with the exception of the layers doped with decreasing concentration, are described in "Choosing and Using CMOS" by I. Walsh (Collins Professional and Technical Books, London, ISBN 0-00-383042-X).

A polished disk-shaped wafer, approximately 0.3 mm thick, of an N-type silicon crystal as used currently in the semiconductor industry serves as substrate 1.

A process for the production of the described photo-detector starts with the heavy doping of the back 6 by means of a conventional element of the Fifth main group of the periodic table, e.g. N++ layer 9 thus produced makes it possible to obtain an ohmic contact 11 to an adjoining metal layer (e.g. aluminum) on the back 6 and serving as a terminal 7.

In an additional subsequent production step, the front of the substrate 1 is doped lightly at the surface by means of ion implantation of an element of the Fifth main group of the periodic table e.g. phosphorus, with a surface density of approximately $10^{13} cm^{-2}$. A subsequent annealing process, for instance at 1000° C. for approximately 30 minutes in a nitrogen atmosphere allows possible defects created by the implantation to heal in the crystalline structure and makes it possible for the doping zone to extend in a controlled manner into the depth of substrate 1, resulting in the creation according to the invention of an N+ layer 8 with a doping concentration that decreases as depth increases.

Figure 2:
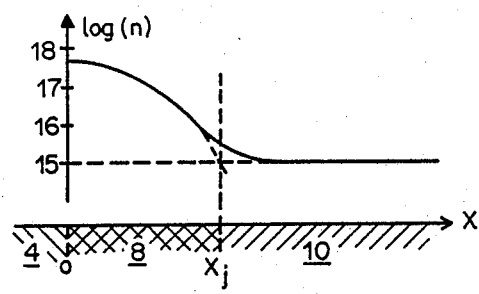
FIG. 2 is a schematic representation of the concentration n of impurity atoms in the photo-detector of FIG. 1.

The front of substrate 1 is rendered passive at the surface. The insulation layer 3, approximately 500 nm thick, is preferably made of silicon dioxide. An entrance window 2 for the admission of the radiation 5 is cut into the cover layer 3 by means of photolithographic processes. Finally the electrode 4 which is transparent to radiation 5 is provided. The electrode 4, together with substrate 1 or layer 8 constitute a Schottky contact 12. Electrode 4 is made of a metal (preferably silver or gold) or of a metal silicide (e.g. platinum silicide) with a thickness from 5 nm to 10 nm. An electrically conductive metal oxide (preferably of tin, of indium or a mixed oxide of both) with a thickness of up to 500 nm is also suitable for electrode 4. If the entrance window 2 has a large surface it is best to reinforce the conducting capacity of electrode 4 by means of a screen-shaped conductor. In another embodiment the entrance window 2 may contain a nonconductive oxide layer in place of electrode 4, for example one which lowers the reflection of the portion of radiation 5 with shorter wavelengths. An auxiliary electrode which surrounds the window in the manner of a ring bonds to the N+ layer 8 via additional windows. The concentration n of impurity atoms in the crystal of the photo-detector is distributed as a function of the distance x from the surface of substrate 1, as shown in FIG. 2. In the graph of FIG. 2, the ordinate is the logarithm (base 10) of the density n. The corresponding layers of the diode are indicated by hatch marks below the abscissa. The concentration n in layer 8 lies between $10^{17} cm^{-3}$ and $10^{18} cm^{-3}$ directly at the surface of substrate 1 and drops to a value of approximately $10^{15} cm^{-3}$, at a depth $x_j$ of approximately 500 nm in the intermediate layer 10.

Figure 3:
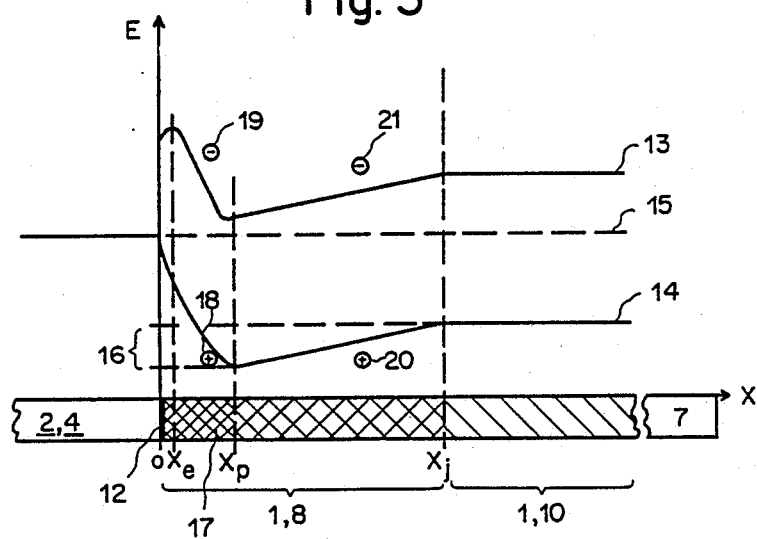
FIG. 3 is a band diagram of the photo-detector of FIG. 1.

This distribution of the impurity atoms in the crystal causes deformation of the electronic band structure as shown in FIG. 3. The potential of the lower edge 13 of the conduction band and that of the upper edge 14 of the valence band are represented in the area of the N+ layer 8 and of the intermediate layer 10 as functions of the distance x from the surface of substrate 1. The corresponding layers of the diode are indicated by hatch marks below the abscissa 9. Electrode 4 determines the Fermi level 13. The potential of the upper edge 14 of the valence band drops off from the potential value of the Fermi level as depth increases to a distinct minimum located at a depth $x_p$ of approximately 50 nm to 200 nm and rises by a potential threshold 16 of approximately 0.1 eV at a depth $x_j$ to the potential which is typical for the intermediate layer 10. The potential threshold 16 in the band edge 14 serves to delimit a detector volume 17. Therefore a hole 18 originated by a pair of charged particles produced in the detector volume 17 can wander only to electrode 4 and is filled up there by an electron from the conduction band of the electrode 4. The lower band edge 15 of the conduction band has a maximum of a few nanometers below electrode 4 at a small depth $x_e$ due to the metallic electrode 4. This maximum forces an electron 19, produced with hole 18, to wander out of the detector volume 17 to the terminal 7. This produces an effective electromotive force which can be used as an output signal to detect radiation 5.

The pairs of charged particles produced down to a depth $x_e$ flow to the electrode 4 and recombine there without contributing anything to the output signal.

The portion of radiation 5 with longer wavelengths produces charged particles, e.g. a hole 20 and an electron 21, also outside the detector volume 17 in layers 8 and 10. Due to the potential threshold 16 these can only wander in direction of connection 7. There the hole 20 and the electron 2 recombine and they too contribute nothing to the effective electromotive force.

The potential threshold 16 constitutes an effective boundary of the detector volume 17. The portion of radiation 5 with shorter wavelengths is almost completely absorbed in the detector volume 17 whereas only a small portion of the longer-wavelength radiation 5 produces charged particles in detector volume 17 which contribute to the effective electromotive force. The choice of parameters in ion implantation and in the annealing process as well as the type of impurity atoms determine the depth of the potential threshold within the photo-detector and thereby its spectral sensitivity.

Figure 4:
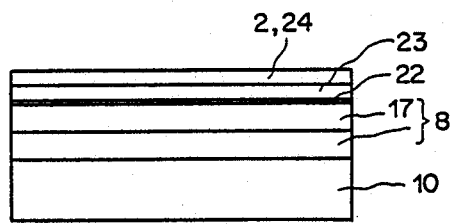
FIG. 4 is a representation of a photo-detector with a P-N junction in accordance with an illustrative embodiment of the present invention.

In another embodiment of the invention the Schottky contact 12 is replaced by a P-N junction 22 (FIG. 4). A P++ layer 23 which is only 10 nm to 30 nm thick and is doped as evenly as possible constitutes together with the N+ layer 8 the P-N junction in the immediate vicinity of the substrate surface near the entrance window 2. The P++ layer 23 has a better contact with the detector volume 17 if only an insulating anti-reflection coating 24 is provided instead of the electrode 4 (FIG. 1) in the entrance window 2 (FIG. 4).

The P-N junction 22 is produced after the annealing process. Through implantation of impurity ions of an element of the Third main group of the periodic table e.g. boron, in a concentration of approximately $10^{19} cm^{-3}$ to $10^{20} cm^{-3}$ the N+ layer 8 is doped into a P++ layer 23 near the surface.

Figure 5:
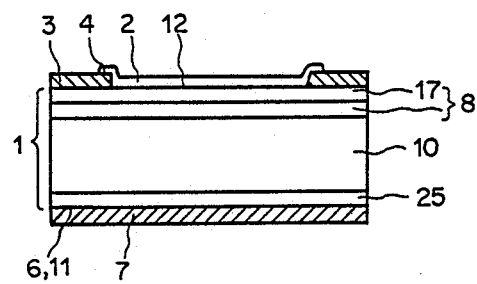
FIG. 5 shows a schematic cross-section through a diode being used as a photo-detector with a Schottky contact and made of a P-type semiconductor in accordance with an illustrative embodiment of the present invention.

Another embodiment of the photo-detector utilizes a substrate 1 made of a P-type material (FIG. 5). Substrate 1 is provided with an ohmic contact 11 on the back 6 in a known manner by using aluminum. Thereby, a P+ layer is 25 formed under the aluminum layer as a result of diffusion. The aluminum layer serves as terminal 7. In the process described so far the detector volume 17 is bounded at the front of substrate 1 by means of the N+ layer 8 built in under the entrance window 2 and a Schottky contact is produced on the N+ layer 8 by means of electrode 4. The potential threshold 16 (FIG. 3) is over 0.3 eV higher than that which can be attained in an N-type substrate 1 because the band edges 13 and 14 are higher relative to the Fermi energy 15 (FIG. 3) in the intermediate layer 10 (FIG. 5).

For example, a P-type zone 26 (FIG. 6) built into an N-type substrate 1 can be used to advantage instead of a P-type substrate 1, or an N-type zone 26 built into a P-type substrate can be used instead of an N-type substrate 1.

Photo-detectors with an MOS structure are yet another advantageous embodiment of the invention.

Figure 6:
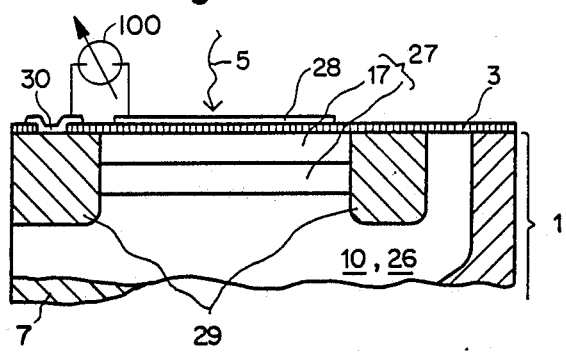
FIG. 6 shows a schematic cross-section through an N-type channel MOS capacitor used as a photo-detector in accordance with an illustrative embodiment of the present invention.

FIG. 6 shows an N-channel MOS capacitor on the nearly homogeneously doped P-type substrate 1. The P-type zone 26 has a lightly doped P+ layer 27 with a concentration of impurity atoms that decreases from approximately $10^{17} cm^{-3}$ at the surface to $10^{15} cm^{-3}$ in the intermediate layer 10. The front of substrate 1 is covered with the insulating cover layer 3 made of 50 nm silicon dioxide which is transparent to radiation 5 and with the transparent, metal conductive gate 28 above it. The detector volume 17 is bounded either by intermediate layer 10 with the terminal 7 applied at the back as shown in FIG. 5 or from the front by means of a heavily doped P++ contact 29 (FIG. 6) which is contacted through a window 30 in the cover layer 3. An external evaluating instrument 100 measures the capacity of the MOS capacitor as an output signal between gate 28 and terminal 7 or P++ contact 29. The P++ contact 29 preferably surrounds the P+ layer 27 in a ring-like manner.

Figure 7:
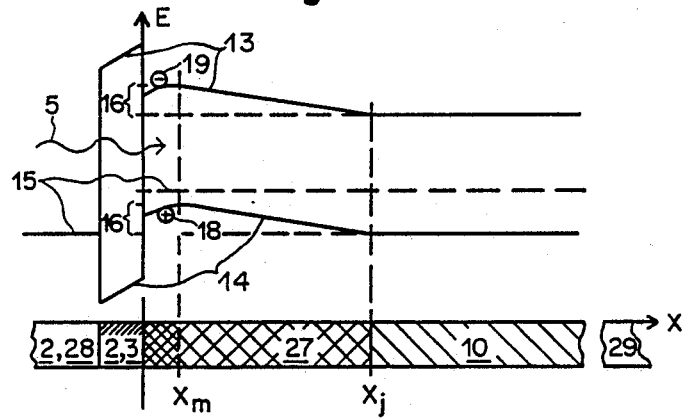
FIG. 7 is a schematic representation of the electronic band structure in the photo-detector of FIG. 6.

Gate 28 and the cover layer 3 are made to advantage as anti-reflection coating for the portion of radiation 5 with shorter wavelengths. FIG. 7 shows schematically the electronic band structure in the crystal in an embodiment according to FIG. 6. The Fermi energy 15 (FIG. 7) and the energy of the band edges 13 and 14 are represented as functions of the distance x from the surface of substrate 1. The corresponding layers of the N-channel MOS structure are indicated by hatch marks below the abscissa. The potentials of the two band edges 13 and 14 increase away from the cover layer 3 to reach a maximum at a depth $x_m$ of approximately 50 nm to 200 nm and after that drop down to the values of the intermediate layer 10 at the depth $x_j$ of 200 nm to 500 nm due to the P+ layer 27 doped with impurity atoms in decreasing concentration. The P+ layer 27 therefore contains the potential thresholds 16. In this arrangement too, the potential thresholds 16 delimit the detector volume 17 at a depth $x_m$.

Of the pairs of charged particles that were produced up to a depth $x_m$, electron 19 wanders directly beneath the cover layer 3. Hole 18 is under the potential threshold 16. These separated pairs of charged particles produced by the radiation 5 increase the capacity of the n-channel MOS capacitor. The charged particles produced at a depth greater than $x_m$ recombine on the P++ contact 29 and contribute nothing to increase the capacity.

The MOS capacitor is emptied periodically by means negative impulse directed upon gate 28 if a dose rate of radiation 5 is to be measured.

Figure 8:
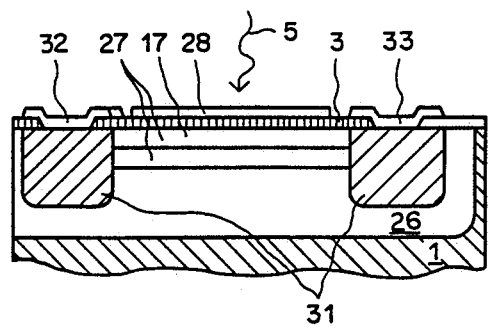
FIG. 8 shows a schematic cross-section through an N-type channel MOS resistance being used as a photo-detector in accordance with an illustrative embodiment of the present invention.

Another advantageous embodiment of the instant invention contains an N-channel MOS photo-resistor (FIG. 8). The flat P+ layer 27 containing the limited detector volume 1 is imbedded in the P-type zone 26 of substrate 1, e.g. in cuboid form. Each of two lateral surfaces of the P+ layer 27 is contacted by a cross-piece 31 made of an N+ material. The cross-pieces 31 extend from the surface of the substrate down into zone 26 beyond the P+layer 27. The two cross-pieces 31 are electrically connected to each other by the detector volume 17. The entering radiation 5 produces a density of charged particles dependant upon its intensity beneath gate 28 which is separated from substrate 1 by a cover layer 3 made of silicon dioxide and therefore changes the electrical resistance between the two cross-pieces 31. The cross-pieces 31 are contacted by a source contact 32 and by a drain contact 33 formed through windows in the cover layer 3.

The n-channel MOS photo resistor can also be operated as a transistor in which case the potential of gate 28 can be controlled.

The different dopings are preferably produced by means of ion implantation of an element of the Third main group of the periodic table whereby the annealing process is also advantageous for the doped P+ layer 27 according to the invention.

Instead of the N-channel, MOS photo-detector embodiments of the invention can also be produced using P-channel MOS structures. In the above descriptions the designations "P" and "N" as well as "hole" and "electron" are interchangeable, whereby the N layers are produced by means of doping with an element of the Fifth main group of the periodic table.

Figure 9:
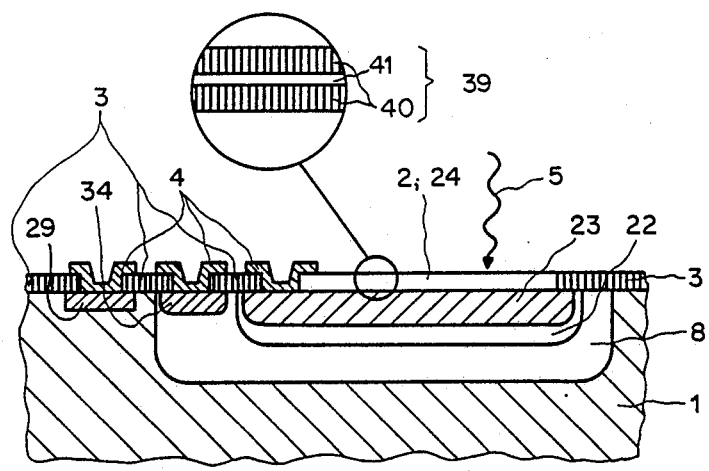
FIG. 9 is a cross-section through a photodiode in accordance with an illustrative embodiment of the present invention.

In another embodiment according to FIG. 9 the detection losses of short-wave ultraviolet light are effectively reduced and the detection losses of visible infrared light are increased and thus the sensitivity as well a the selectivity of the photo-detector is increased for ultraviolet light. The entrance window 2 with the antireflection coating 24 and the cover layer 3 over the substrate 1 as well as the regions located below the entrance window 2 and which are fashioned in the form of troughs, i.e. the P++ layer 23, the N+ layer 8, the P-N junction region 22 between the two layers 8, 23 and the P-type substrate 1 can be recognized. Substrate 1 is contacted by means of the P++ contact 29, the N+ layer 8 by means of an N++ island 34 and the P++ layer 23 directly by metallic electrodes 4.

The manufacture of the photodiode according to FIG. 9 begins with the production of an $SiO_2$ layer, for instance 30 nm thick, on the P-type substrate 1 from a disk of a silicon single crystal by oxidation of the crystal surface. Substrate 1 has typically a concentration of impurity atoms in the crystal between $10^{14} cm^{-3}$ to $10^{16} cm-3$. This $SiO_2$ layer constitutes part of the cover layer 3 or of the entrance window 2. Following this, purposefully predetermined quantities of impurity atoms are implanted at predetermined depths through the $SiO_2$ layer into the body of the semiconductor.

The N+ layer 8 is produced by an implantation of phosphorus ions of predetermined energy, whereby the range of the ions depends on their energy. If the ion energy amounts for instance to 100 keV, a maximum concentration of the phosphorus atoms, typically approximately $10^{18} cm^{-3}$ occurs at a depth of 100 nm below the surface.

Figure 10:
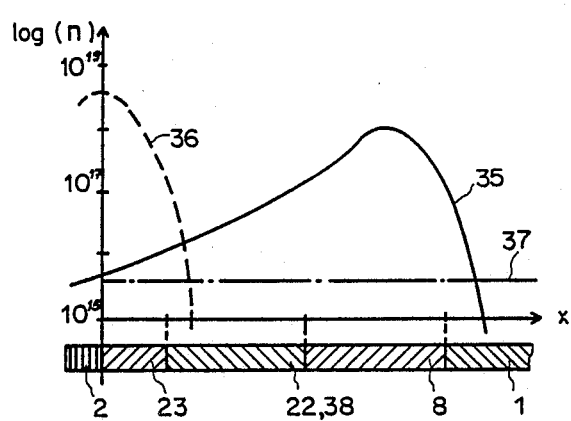
FIG. 10 is a plot of the concentration of impurity atoms in the photodiode of FIG. 9.

FIG. 10 shows the concentration n of impurity atoms (in $cm^{-3}$) in logarithmic representation as a function of the distance x from the surface. Below the abscissa, a schematic cross-section through the photo-detector is drawn at the same scale. A solid curve 35 shows the typical profile of the phosphorus concentration.

The high concentration of the phosphorus at the surface of the N++ island 34 is produced by means of phosphorus ions of predetermined, low energy, e.g. between 10 keV and 20 keV. These ions penetrate the N+ layer 8 to a depth of 15 nm for example, whereby the maximum concentration lies at the interface between the cover layer 3 and the semiconductor crystal.

An implantation of boron ions of predetermined energy produces the P++ layer 23 and the P++ contact 29. If boron ions of 8 keV to 12 keV are used, the maximum concentration occurs at the interface between the entrance window 2 or the cover layer 3 and the semiconductor crystal. The thickness of the P++ layer 23 and of the P++ contact 29 is approximately 15 nm to 30 nm. A maximum concentration of $10^{18}$ to $10^{19} cm^{-3}$ is advantageous. A preferred concentration profile of the boron atoms is shown in FIG. 10 by means of a broken line 36.

The concentration of impurity atoms of substrate 1 is indicated by a line 37 made of dashes and dots.

The rapid drop of the concentration of boron below the P++ layer 23 to approximately $10^{16} cm^{-3}$ at a depth of approximately 30 nm and the slow rise of the phosphorus concentration at greater depth causes a separation of the P++ layer 23 from the N+ layer 8 by a zone 38, approximately 30 nm to 60 nm wide including the P-N junction region 22. Since the concentration of impurity atoms amounts to less than $10^{17} cm^{-3}$ the zone is practically intrinsic. For this reason the structure of the photodiode in this embodiment is similar to that of a PIN diode.

The subsequent annealing process serves to incorporate the implanted ions into the semiconductor crystal (electric activation), whereby substrate 1 is heated up several times for only a very short period of time, e.g. for 1 to 3 seconds, to a temperature of > 900° C. in order to avoid a diffusion of the impurity atoms.

Figure 11:
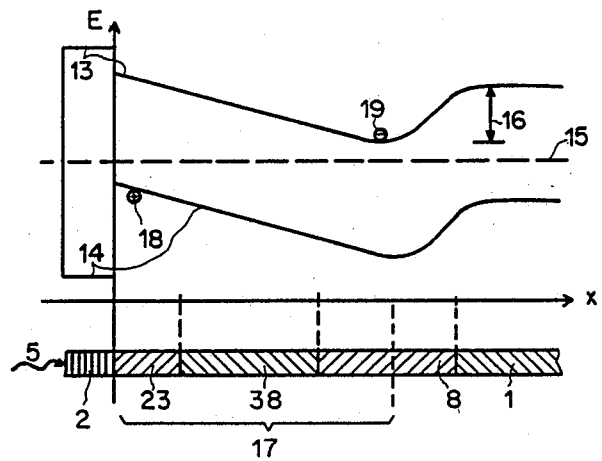
FIG. 11 shows the band structure of the photodiode of FIG. 9.

FIG. 11 shows the energy of the lower band edge 13 of the conduction band and of the upper band edge 14 of the valence band in the semiconductor crystal as a function of the distance x to the surface. Reference number 15 designates the FERMI energy. A cross-section through the photo-detector at the same scale is shown under the abscissa.

The concentration profiles according to the instant invention produce the band edges, 13, 14 in the crystal. The band edges 13, 14 drop from the entrance window 2 to a minimum energy value in the N+ layer 8 and then rise back in the P-type substrate 1, only after the depth of the maximum of the boron concentration is exceeded. This rise produces the potential threshold 16 which is needed to limit the effective detector volume 17. Since the maximum energy of the band edges 13, 14 occurs directly at the interface between the entrance window 2 and the P++ layer 23, this structure of the photo-detector avoids a dead zone below the entrance window 2. This advantageously increases the sensitivity of the photo-detector, said sensitivity attaining practically 100% for ultraviolet light.

The effective detector volume 1 extends from the inlet window 2 to the minimum in the N+ layer 8. The pairs of charged particles produced in the detector volume 17 by the radiation 5 of mainly shorter wavelength are separated, whereby the electrons 9 collect in the energy minimum of the lower band edge 13 in the N+ layer 8 and the holes 18 collect below the entrance window 2 in the P++ layer 23 due to the potential threshold 16, whereby an effective electromotive force of approximately 0.1 V occurs.

The radiation of longer wavelength penetrates into the substrate 1 to a depth of over 100 nm. It produces charged particle pairs outside the detector volume 17 in substrate 1, and said charged particle pairs are not separated and recombine in substrate 1 and thus do not contribute to the output signal.

The sensitivity and selectivity of the photo-detector for short-wave radiation can be improved by means of the anti-reflection coating 24, an example of which is shown in FIG. 9 in form of the interference filter 39. The interference filter 39 is built up of thin layers comprising alternating oxide layers 40 and metal layers 41. In an enlarged section of FIG. 9, an example of the design of the interference filter 39, with two oxide layers 40 made of $SiO_2$ and with a metal layer 41 imbedded between them is shown. The interference filter 39 is transparent to a radiation with a wavelength of 300 nm, but effectively weakens radiation 5 of longer wavelengths.

To make the filter, the cover layer 3 measuring 30 nm which is needed in the implantation is first increased to a thickness of 50 nm by means of vacuum deposition. Following this, the surface of the first oxide layer 40 is vacuum-metallized with a metal layer 41, at least in the area of entrance window 2 above the P++ layer 23. Layer 41 is preferably made of aluminum and is 10 nm thick. A 50 nm thick layer of $SiO_2$, i.e. an oxide layer 40, again follows this metal layer 41.

Greater selectivity of the interference filter 39 is achieved by a greater number of these layers 40, 41.

In an embodiment according to FIG. 9, a surface of 1 mm$^2$ is preferred for the inlet window 2, but the size is only limited by the surface of the available substrate 1.

Several photo-detectors can be produced simultaneously on one wafer and can also be combined directly with additional elements of an integrated circuit. The number is merely limited by the space requirements of individual circuits. The space requirement of reliably operating photo-detectors on substrate 1 is small and they can be produced in a size 0.4 mm × 0.4 mm.

Finally, the above-described embodiments of the invention are intended to be illustrative only. Numerous alternative embodiments may be devised by those skilled in the art without departing from the spirit and scope of the present invention.

What is claimed:

1. A photodetector for detecting ultraviolet electromagnetic radiation comprising:
   a semiconductor body,
   an entrance window for said radiation defined at a surface of said semiconductor body;
   a doped layer formed at said surface of said semiconductor body below said entrance window and having a graded impurity distribution such that the density of impurities decreases with depth in said layer, and
   a non-ohmic contact formed for contacting said doped layer,
   said doped layer having energy bands which are deformed in the vicinity of said noon-ohmic contact to produce a potential threshold, said potential threshold and said non-ohmic contact delimiting a detection volume therebetween in which said ultraviolet radiation is absorbed.

2. The photodetector of claim 1 wherein said non-ohmic contact is transparent to said radiation and is formed over said entrance window.

3. The photodetector of claim 2 wherein said non-ohmic contact is a Schottky contact comprising a conducting electrode formed on said doped layer.

4. The photodetector of claim 2 wherein said non-ohmic contact comprises a P-N junction.

5. The photodetector of claim 2 wherein said non-ohmic contact is an MOS gate structure comprising an insulating layer formed on said doped layer and a conducting gate layer formed on said insulating layer.

6. The photodetector of claim 5 wherein said detection volume is located between said gate structure and a heavily doped contact of said semiconductor body and wherein said detection volume forms a capacitor whose capacity depends on charged particles produced by said radiation in said detection volume.

7. The photodetector of claim 5 wherein said detection volume is located between a source contact and a drain contact of said semiconductor body and wherein said detector volume forms a photoresistor having a resistance which depends on charged particles produced by said radiation in said detection volume and a potential of said gate structure.

8. The photodetector of claim 4 wherein said P-N junction is formed by a layer of p++ type material and a layer of N+ type material with a quasi-intrinsic conducting zone being located between said p++ and N+ layer and having a thickness in a range of 30nm to 60nm.

9. The photodetector of claim 3 wherein said semiconductor body is a silicon body and said detecting volume extends to a depth between 50nm and 200nm from said entrance window.

10. The photodetector of claim 1 wherein an antireflection coating for said radiation is formed over said entrance window.

11. The photodetector of claim 9 wherein said antireflection coating comprises an interference filter formed from a plurality of layers.

* * * * *